United States Patent [19]

Chang

[11] Patent Number: 5,091,728
[45] Date of Patent: Feb. 25, 1992

[54] D/A AND A/D CONVERTERS UTILIZING WEIGHTED IMPEDANCES

[76] Inventor: Chih C. Chang, 515 Station Rd., Apt. D-6, Huntingdon Valley, Pa. 19006

[21] Appl. No.: 567,240

[22] Filed: Aug. 13, 1990

Related U.S. Application Data

[63] Continuation-in-part of Ser. No. 488,286, Mar. 2, 1990, abandoned.

[51] Int. Cl.$^5$ .............................................. H03M 1/80
[52] U.S. Cl. .................................... 341/153; 341/165
[58] Field of Search ............... 341/153, 144, 148, 154, 341/155, 158, 165

[56] References Cited

U.S. PATENT DOCUMENTS 4,293,848  10/1981  Cheng et al. ..................... 340/347
4,354,175  10/1982  Goldstein ......................... 340/347

OTHER PUBLICATIONS

"Integrated Electronics: Analog and Digital Circuits and Systems", Millman and Halkias, (1972) McGraw-Hill Book Co., New York, N.Y., pp. 662 and 664.

"Data Conversion/Acquisition Data Book", National Semiconductor, 1980, pp. 5-1 and 7-3.

Primary Examiner—A. D. Pellinen
Assistant Examiner—Brian Young
Attorney, Agent, or Firm—William H. Murray

[57] ABSTRACT

An apparatus for converting the sum of m digital signals to an analog signal utilizing resistors and switches only. The operating time of the apparatus is the time required to pass the signal through a single switch. This invention can also be utilized in an A/D converter for converting the difference between an analog signal and several digital signals to a digital signal without using extra time to compute the subtraction.

4 Claims, 4 Drawing Sheets

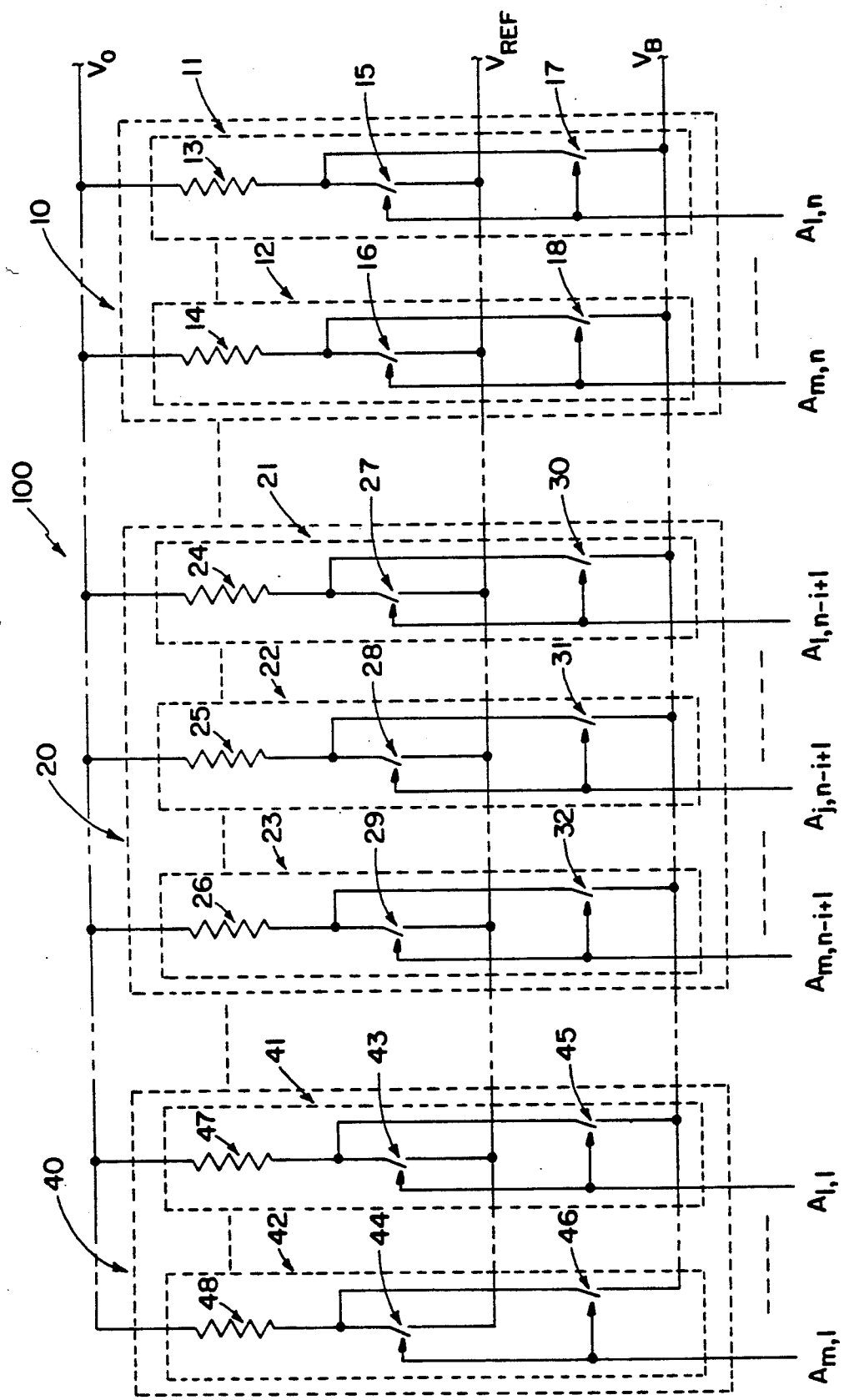

D/A AND A/D CONVERTERS UTILIZING WEIGHTED IMPEDANCES

CROSS REFERENCE TO RELATED APPLICATIONS

This application is a continuation-in-part of my prior, co-pending U.S. patent application Ser. No. 07/488,286, filed Mar. 2, 1990, now abandoned, entitled "Fast D/A and A/D Converters."

BACKGROUND OF THE INVENTION

This invention relates to digital to analog (D/A) and analog to digital (A/D) converters and more particularly to a method and apparatus for converting one digital signal to an analog signal or several digital signals to an analog signal which represents the sum of these digital signals.

Digital to analog converters presently utilize active devices such as operational amplifiers, comparators, etc. in performing the conversion functions. These active device(s) lengthen the operation time and increase the size of the D/A converter. Furthermore, most D/A converters can convert only one digital signal at a time. Those D/A converters which can convert several digital signals to an analog signal representing the sum of these digital signals need either extra time to compute the sum of the digital numbers represented by the digital signal or they utilize operational amplifiers. Either way will lengthen the D/A converter's performing time. Furthermore, many A/D converters use a D/A as a component. A D/A that is slow or large in size, means that the utilizing A/D will also be slow or large in size. The fast A/D, which does not employ a D/A, uses a large number of resistors. For example, the Type ADC0800 8-bit D/A Converter shown and described in the National Semiconductor publication entitled "Data Conversion/Acquisition Databook", 1984, National Semiconductor, requires 256 series resistors.

SUMMARY OF THE INVENTION

It is therefore an object of the present invention to provide an apparatus and method for performing D/A conversion which operates at a higher speed than the apparatuses and methods of the prior art.

It is another object of the present invention to provide an apparatus and method for performing fast D/A conversion which has a smaller size than the apparatuses and methods of the prior art.

It is a further object of the present invention to provide an apparatus and method for performing the conversion and the sum of several digital signals to an analog signal without using extra time to compute the sum.

It is yet another object of the present invention to provide an apparatus and method for performing the conversion of the difference between analog voltage and several digital signals to a digital signal without using extra time to compute the subtraction.

These and other objects of the present invention are obtained by providing a D/A converter which use resistors and switches only. Because the converter uses no active device other than switches, the D/A converter of this invention will be faster and smaller than the apparatuses and methods of the prior art. The only time needed to operate the D/A converter of the present invention is the time needed for the signal to pass through a switch since no active devices are utilized.

Other objects, features and advantages of the present invention will be more fully apparent from the following detailed description of the preferred embodiment, the appended claims and the accompanying drawing.

BRIEF DESCRIPTION OF THE DRAWING

FIG. 4 is a schematic diagram of the D/A converter depicted in FIG. 1 with k=2.

DETAILED DESCRIPTION OF THE INVENTION

The D/A invention will operate m digital numbers having a base k>1. The first part of the detailed description discusses the general case where the input digital signals represent digital numbers having a base $k \geq 2$. The latter part of the detailed description discusses the case where the input digital signals represent binary digital numbers; that is, where k=2.

Representation of digital number with base $K \geq 2$.

For a given positive number $K \geq 2$, let $G(k) = \{A | A$ is a n-bit digital number with base $K\}$, and $H(k) = \{A \epsilon G(k) |$ each bit of A is either "0" or "1"$\}$.

Define $f_k$: $H(k)^{k-1} \rightarrow G(k)$ by $f_k(A_1, A_2, \ldots, A_{k-1}) = A$, such that the jth bit of $$A = \sum_{i=1}^{k-1} A_{i,j}$$

where $A_i, A_2, \ldots, A_{k-1} \epsilon H(k)$ and $A \epsilon G(k)$.

$H(k)^{k-1} = \{T \subset H(k) | T$ is a subset of H(k). The cardinal number of T is $k-1\}$.

It is clear that $f_k$ is a function mapping $H(k)^{k-1}$ onto G(k). $f_k$ is not a one to one function for k>2 and $f_k$ is an identify function for k=2.

With the function $f_k$ so defined, a digital number A with base $K \geq 2$ can be expressed in binary form.

EXAMPLE 1

Let n=8, k=4 and $A_1, A_2, A_3$ belong to H(k) LSB
A1=0 1 0 1 1 1 0 0
A2=1 1 0 1 1 0 0 1
A3=1 1 0 0 1 0 1 1
Then $f_k$ (A1, A2, A3) = 2 3 0 2 3 1 1 2

For purposes of this detailed description, a switch that is closed when the control of the switch is a logic 1 and open when the control of the switch is a logic 0 is called an S switch. In addition, a switch that is open when the control of the switch is a logic 1 and closed when the control of the switch is a logic 0 is called a W switch.

Figure 1:
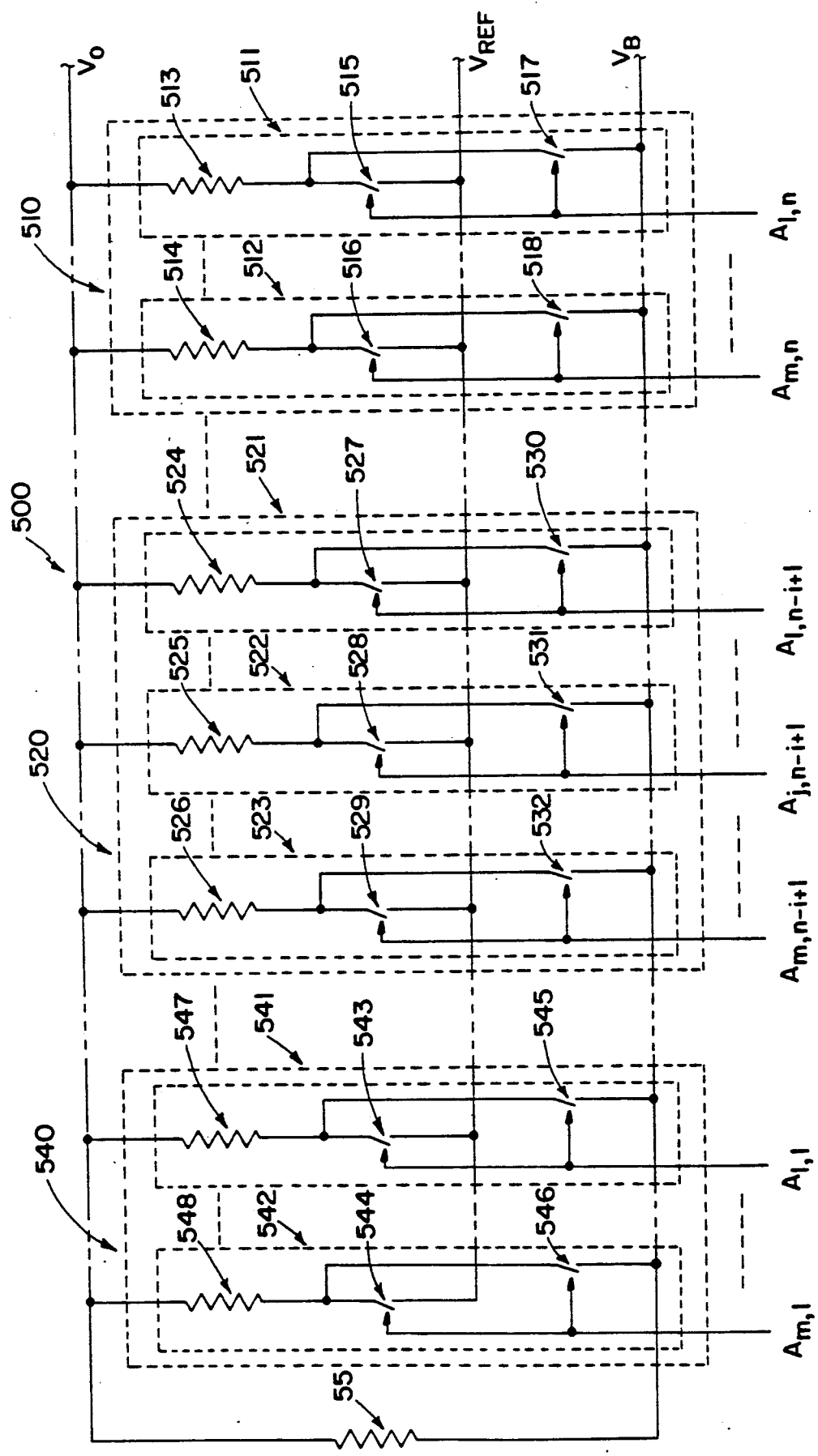
FIG. 1 is a schematic diagram of a preferred embodiment of a D/A converter in accordance with the present invention.

Referring now to FIG. 1, there is depicted an n-bit D/A converter in accordance with the present invention, generally designated 500. The D/A converter 500 can convert the sum of digital signals in H(k) to an analog output voltage $V_o$ with $V_{REF} \geq V_o \geq V_B$, where $V_{REF} > V_B$ and $V_B$ is a fixed voltage corresponding to the zero input. The D/A converter 500 comprises n groups and an impedance 55 where n equals the number of binary bits in each of the m input digital signals in H(k) of the D/A converter 500.

The m inputs of the digital signals in H(k) of the D/A converter 500 are denoted by $A_1, A_2, \ldots A_m$. Where $A_1 = A_{1,1}, A_{1,2}, \ldots, A_{1,i}, \ldots, A_{1,n}$
$A_2 = A_{2,1}, A_{2,2}, \ldots, A_{2,i}, \ldots, A_{2,n}$
$A_j = A_{j,1}, A_{j,2}, \ldots, A_{j,i}, \ldots, A_{j,n}$
$A_m = A_{m,1}, A_{m,2}, \ldots, A_{m,i}, \ldots, A_{m,n}$ The least significant bit of $A_i$ is denoted by $A_{i,1}$, for $i = 1, 2, \ldots, m$. The jth bits of $A_i$ are denoted by $A_{i,j}$, for $j = 1, 2, \ldots, n$, and $i = 1, 2, \ldots, m$ respectively.

For n bit input digital signals in H(k), there will be n groups and an impedance 55 in the D/A converter 500. As shown in FIG. 1 the D/A converter 500 comprises a first group 510, an ith group 520, an nth group 540 and an impedance 55. For m input digital signals in H(k), there will be m cells in each of these n groups. For example, for four input signals, M=4, each input signal having eight bits, n=8, there will be eight groups of cells with each group having four cells. As shown in FIG. 1, the first group 510 of FIG. 1 comprises a first cell 511 and a mth cell 512. The ith group 520 comprises a first cell 521, a jth cell 522 and a mth cell 523. The nth group 540 comprises a first cell 541 and a mth cell 542.

The jth cell 522 of the ith group 520 in FIG. 1 comprises an impedance 525, an S switch 528 and a W switch 531. One terminal of the impedance 525 is coupled to the analog voltage output $V_o$. The other terminal of the impedance 525 is connected to an output terminal of S switch 528 and an input terminal of W switch 531. The input terminal of the S switch 528 is coupled to $V_{REF}$. The output terminal of W switch 531 is connected to $V_B$. The control of the S switch 528 is connected to the control of the W switch 531 and is coupled to the (n−i+1)th bit of the input digital signal $A_j$ in H(k). One terminal of impedance 55 is coupled to $V_o$. The other terminal of the impedance 55 is coupled to $V_B$.

If inverters are utilized in the D/A converter of the present invention, all the switches in the D/A converter can be the same type, either S switches or W switches. However, the operation time may be slower, since the signal requires additional time to pass through the inverter; that is, the signals passing through the switches will be slowed by the inverter stages.

All the cells in all the groups are substantially the same, except the value of the impedance and the bit of the input digital signal in H(k) which is the control of the S switch and the W switch of the cell. For any two cells which belong to the same group, the value of its impedances are always equal. The value of the impedance of a cell in the first group is denoted by Z. The value of the impedance of a cell in the ith group is $k^{i-1}Z$, for $i = 1, 2, \ldots n$. The value of the impedance 55 is $Z_e/m$, where m is the number of input digital signals in H(k). $Z_e$ will be described later. If a cell belongs to the ith group, the control of the S switch of the cell is connected to the control of the W switch of the cell and is coupled to the (n−i+1)th bit of one and only one of the m input digital signals in H(k), for $i = 1, 2, \ldots n$.

When $m = r(k−1)$ for some positive integer r and $Z_e/Z$ is a real number, FIG. 1 is a D/A converter circuit converting the sum of r digital signals in G(k) into an analog signal. The output voltage $V_o$ is $$V_o = V_B + \frac{\frac{Z_e}{Z} \sum_{i=1}^{m} \sum_{j=1}^{n} A_{i,j} k^{j-1}}{k^{n-1}m + \frac{Z_e}{Z} m \sum_{j=1}^{n} k^{j-1}} (V_{REF} - V_B) \quad (1)$$

When the input switch control of a cell is a logic "1", the impedance of that cell will be connected between $V_{REF}$ and $V_o$. When the input switch control of a cell is a logic "0", the impedance of that cell will be connected between $V_o$ and $V_B$. Using Ohm's law, the output voltage $V_o$ in FIG. 1 is given by formula (1).

When $Z_e = \infty$, $m = r(k−1)$ for some positive integer r, the apparatus of FIG. 1 is a D/A converter circuit for converting the sum of r digital signals in G(k) into an analog signal. For this case, the output voltage $V_o$ of the converter depicted in FIG. 1 is $$V_o = V_B + \frac{\sum_{i=1}^{m} \sum_{j=1}^{n} A_{i,j} k^{j-1}}{m \sum_{j=1}^{n} k^{j-1}} (V_{REF} - V_B) \quad (2)$$

When $Z_e = k^{n-1}(k−1)Z$, $m = r(k−1)$ for some positive integer r and $Z_e/Z$ is a real number, the apparatus of FIG. 1 is a D/A converter circuit for converting the sum of r digital signals in G(k) into an analog signal. For this case, the output $V_o$ of FIG. 1 is $$V_o = V_B + \frac{\sum_{i=1}^{m} \sum_{j=1}^{n} A_{i,j} k^{j-1}}{rk^n} (V_{REF} - V_B) \quad (3)$$

The apparatus of FIG. 1 also can convert binary digital signals into an analog signal. All the formulae (1), (2), (3) and (4) and the circuit in FIG. 1 are also true for the case k=2 and m=r.

When K=2, Z=R (a resister), $Z_e = 2^{n-1}R$ and r=1 (i.e. m=1), the apparatus of FIG. 1 is a D/A converter circuit for converting one binary digital signal into an analog signal. In this case, the output $V_o$ of FIG. 1 is $$V_o = V_B + \frac{\sum_{i=1}^{n} A_{i,j} k^{j-1}}{2^n} (V_{REF} - V_B) \quad (4)$$

The following considerations are suggested when designing a D/A or A/D converter in accordance with the present invention. It is not necessary that these considerations be made in the order given. First, determine the positive integer k. This k is the base of the digital signals the D/A or A/D converter will convert. Next, determine the positive integer r. Each group in FIG. 1 and 4 then has r(k−1) cells. Next, determine the inverse of the function $f_k$. Note that $f_k$ is not a one to one function for K>2, the choice of the inverse of f is left up to the discretion of the designer. Next, determine which formula, (1), (2), (3) or (4), will be used. Then choose the value of Z and $Z_e$ to satisfy the formula which was selected.

The following portion of the detailed description sets forth the case where the input digital signals represent binary digital numbers; that is, where k=2. In this portion of the detailed description, reference is made to FIG. 4 and the following notations and definitions are used:

The m inputs of the binary digital signals of the D/A converter 100 are denoted by $A_1, A_2, \ldots A_m$. Where $A_1 = A_{1,1}, A_{1,2}, \ldots, A_{1,i}, \ldots, A_{1,n}$
$A_2 = A_{2,1}, A_{2,2}, \ldots, A_{2,i}, \ldots, A_{2,n}$
$A_j = A_{j,1}, A_{j,2}, \ldots, A_{j,i}, \ldots, A_{j,n}$
$A_m = A_{m,1}, A_{m,2}, \ldots, A_{m,i}, \ldots, A_{m,n}$ The least significant bit of $A_i$ is denoted by $A_{i,l}$, for $i=1, 2, \ldots, m$. The jth bits of $A_i$ are denoted by $A_{i,j}$, for $j=1, 2, \ldots, n$, and $i=1, 2, \ldots, m$ respectively.

A switch that is closed when the control of the switch is a logic 1 and open when the control of the switch is a logic 0 is called an S switch. A switch that is open when the control of the switch is a logic 1 and closed when the control of the switch is a logic 0 is called a W switch.

Referring now to FIG. 4, there is depicted an n-bit D/A converter in accordance with the present invention, generally designated 100. The D/A converter 100 can convert the sum of digital signals in H(k) to an analog output voltage $V_o$ with $V_{REF} \geq V_o \geq V_B$, where $V_{REF} > V_B$ and $V_R$ is a fixed voltage corresponding to the zero input. The D/A converter 100 comprises n groups where n equals the number of binary bits in each of the m input binary digital signals of the D/A converter 100. For example, for four input signals, $m=4$, each input signal having eight bits, $n=8$, there will be eight groups of cells, with each group having four cells.

For n bit input binary digital signals, there will be n groups in the D/A converter 100. As shown in FIG. 4 the D/A converter 100 comprises a first group 10, an ith group 20 and an nth group 40.

For m input binary digital signals, there will be m cells in each of these n groups. As shown in the first group 10 of FIG. 4 comprises a first cell 11 and a mth cell 12; the ith group 20 of FIG. 4, comprises a first cell 21, a jth cell 22 and a mth cell 23; the nth group 40 of FIG. 4, comprises a first cell 41 and a mth cell 42.

The jth cell 22 of the ith group 20 in FIG. 4 comprises an impedance 25, an S switch 28 and a W switch 31. One terminal of the impedance 25 is coupled to the analog voltage output $V_o$. The other terminal of the impedance 25 is connected to an output terminal of S switch 28 and an input terminal of W switch 31. The input terminal of the S switch 28 is coupled to $V_{REF}$. The output terminal of W switch 31 is connected to $V_B$. The control of the S switch 28 is connected to the control of the W switch 31 and is coupled to the $(m-i+1)$th bit of the input binary digital signal $A_j$.

If inverters are utilized in the D/A converter of the present invention, all the switches in the D/A converter can be the same type, either S switches or W switches. However, the operation time may be slower, since the signal requires additional time to pass through the inverter; that is, the signals passing through the switches will be slowed by the inverter stages.

All the cells in all the groups are substantially the same, except the value of the impedance and the bit of the input binary digital signal which is the control of the S switch and W switch of the cell.

For any two cells which belong to the same group, the value of its impedances are always equal. The value of the impedance of a cell in the first group is denoted by Z. The value of the impedance of a cell in the ith group is $2^{i-1}Z$, for $i=1, 2, \ldots n$.

If a cell belongs to the ith group, the control of the S switch of the cell is connected to the control of the W switch of the cell and is coupled to the $(n-i+1)$th bit of one and only one of the m input binary digital signals, for $i=1, 2, \ldots n$.

With the detailed description of the generalized D/A converter as shown in FIG. 4, the analog output $V_o$ will be $$V_o = V_B + \frac{\sum_{i=1}^{m}\sum_{j=1}^{n} A_{i,j} k^{j-1}}{m \sum_{j=1}^{n} k^{j-1}} (V_{REF} - V_B) \quad (5)$$

Proof:

When $A_{i,j}$ has the logic value "1", an impedance in a cell of $(n-j+1)$th group of the D/A converter of the present invention will be connected across $V_{REF}$ and $V_o$. Since the impedance is in a cell of $(n-j+1)$th group, its value will be:

$$2^{(n-j+1)-1}Z = 2^{n-j}Z \text{ for } j=1, 2, \ldots, n$$

where Z is the impedance in each cell in the first group of the D/A converter of the present invention.

Hence, the total impedance across $V_{REF}$ and $V_o$ will be $$\frac{1}{\sum_{i=1}^{m}\sum_{j=1}^{n} \frac{A_{i,j}}{k^{n-j}Z}} \quad (6)$$

When $A_{i,j}$ has the logic value "0", an impedance in a cell of the $(n-j+1)$th group of the D/A converter of the present invention will be connected across $V_o$ and $V_B$. Since the impedance is in a cell of $(n-j+1)$th group, its value will be $2^{(n-j+1)-1}Z = 2^{n-j}Z$ for $i=1, 2, \ldots, m$ and $j=1, 2, \ldots, n$ Hence, the total impedance across $V_o$ and $V_B$ will be $$\frac{1}{\sum_{i=1}^{m}\sum_{j=1}^{n} \frac{A'_{i,j}}{k^{n-j}Z}} \quad (7)$$

Where $A'_{i,j}$ is the complement of $A_{i,j}$. That is $A'_{i,j}=0$, when $A_{i,j}=1$, and $A'_{i,j}=1$, when $A_{i,j}=0$. Therefore, $$V_o = V_B + \quad (8)$$

$$\frac{\frac{1}{\sum_{i=1}^{m}\sum_{j=1}^{n} \frac{A'_{i,j}}{k^{n-j}Z}}}{\frac{1}{\sum_{i=1}^{m}\sum_{j=1}^{n} \frac{A_{i,j}}{k^{n-j}Z}} + \frac{1}{\sum_{i=1}^{m}\sum_{j=1}^{n} \frac{A'_{i,j}}{k^{n-j}Z}}} (V_{REF} - V_B) =$$

$$V_B + \frac{\frac{1}{\sum_{i=1}^{m}\sum_{j=1}^{n}\frac{A'_{i,j}}{k^{n-j}Z}}}{\sum_{i=1}^{m}\sum_{j=1}^{n}\frac{A'_{i,j}}{k^{n-j}Z} + \sum_{i=1}^{m}\sum_{j=1}^{n}\frac{A_{i,j}}{k^{n-j}Z}} (V_{REF} - V_B)$$

$$\left(\sum_{i=1}^{m}\sum_{j=1}^{n}\frac{A_{i,j}}{k^{n-j}Z}\right)\left(\sum_{i=1}^{m}\sum_{j=1}^{n}\frac{A_{i,j}}{k^{n-j}Z}\right)$$

Simplifying the right hand side of (8), we have $$V_o = V_B + \quad (9)$$

-continued $$\frac{\sum_{i=1}^{m}\sum_{j=1}^{n}\frac{A_{i,j}}{k^{n-j}Z}}{\sum_{i=1}^{m}\sum_{j=1}^{n}\frac{A_{i,j}}{k^{n-j}Z} + \sum_{i=1}^{m}\sum_{j=1}^{n}\frac{A'_{i,j}}{k^{n-j}Z}}(V_{REF} - V_B) =$$

$$V_B + \frac{\sum_{i=1}^{m}\sum_{j=1}^{n}\frac{A_{i,j}}{k^{n-j}Z}}{\sum_{i=1}^{m}\sum_{j=1}^{n}\frac{A_{i,j} + A'_{i,j}}{k^{n-j}Z}}(V_{REF} - V_B)$$

Since $A'_{i,j}$ is the complement of $A_{i,j}$, therefore $A_{i,j} + A'_{i,j} = 1$, for $i=1, 2, \ldots, m$ and $j=, 1, \ldots, n$ Therefore $$\sum_{i=1}^{m}\sum_{j=1}^{n}\frac{A_{i,j} + A'_{i,j}}{k^{n-j}Z} = m\sum_{j=1}^{n}\frac{1}{k^{n-j}Z} \quad (10)$$

Substitute (10) into (9), we have $$V_o = V_B + \frac{\sum_{i=1}^{m}\sum_{j=1}^{n}\frac{A_{i,j}}{k^{n-j}Z}}{m\sum_{j=1}^{n}\frac{1}{k^{n-j}Z}}(V_{REF} - V_B) \quad (11)$$

Since $$\frac{k^{n-1}Z}{k^{n-1}Z} = 1,$$

therefore, both sides of (11) will be still equal, if we multiply the second term of the right hand side of (11) by $$\frac{k^{n-1}Z}{k^{n-1}Z},$$

(11) becomes $$V_o = V_B + \frac{\sum_{i=1}^{m}\sum_{j=1}^{n}\frac{A_{i,j}}{k^{n-j}Z}}{m\sum_{j=1}^{n}\frac{1}{k^{n-j}Z}} \cdot \frac{k^{n-1}Z}{k^{n-1}Z}(V_{REF} - V_B)$$

$$= V_B + \frac{\sum_{i=1}^{m}\sum_{j=1}^{n}\frac{A_{i,j}k^{n-1}Z}{k^{n-j}Z}}{m\sum_{j=1}^{n}\frac{k^{n-1}Z}{k^{n-j}Z}}(V_{REF} - V_B)$$

$$= V_B + \frac{\sum_{i=1}^{m}\sum_{j=1}^{n}A_{i,j}k^{(n-1)-(n-j)}}{m\sum_{j=1}^{n}k^{(n-1)-(n-j)}}(V_{REF} - V_B)$$

$$= V_B + \frac{\sum_{i=1}^{m}\sum_{j=1}^{n}A_{i,j}k^{j-1}}{m\sum_{j=1}^{n}k^{j-1}}(V_{REF} - V_B)$$

For the present invention, the binary digit "1" represents $$\frac{1}{m\sum_{j=1}^{n}k^{j-1}}(V_{REF} - V_B)$$

In particular, when $V_B=0$, that is when $V_B$ is grounded, Formula (5) becomes $$V_o = \frac{\sum_{i=1}^{m}\sum_{j=1}^{n}A_{i,j}k^{j-1}}{m\sum_{j=1}^{n}k^{j-1}}V_{REF} \quad (A)$$

Figure 2:
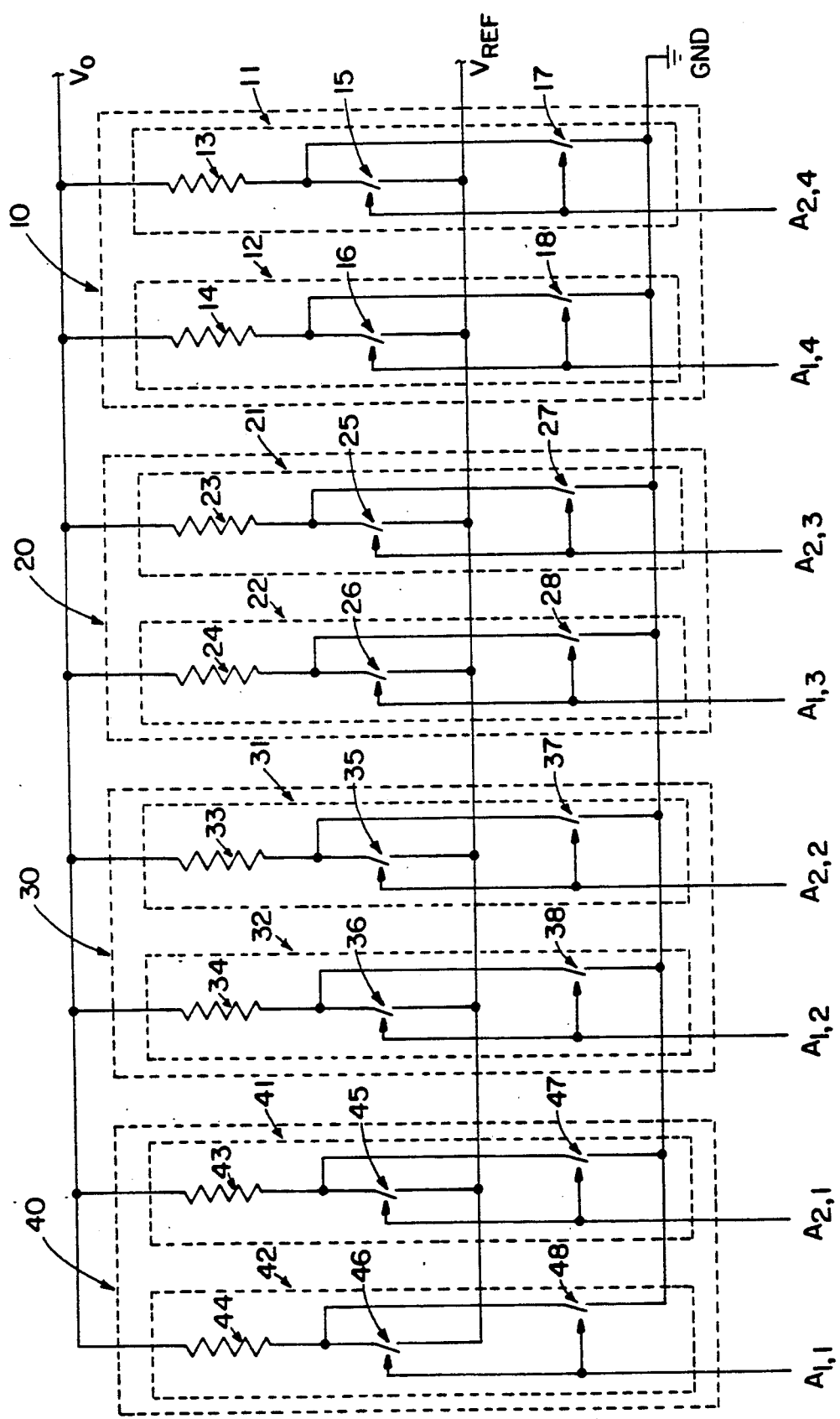
FIG. 2 is a schematic diagram of the D/A converter depicted in FIG. 4 with n=4, m=2, k=2, and $V_B=0$.

Referring now to FIG. 2, there is depicted a $V_B=0$, $k=2$, four bit, D/A converter; that is n=4, constructed in accordance with the preferred embodiment of the present invention depicted generally in FIG. 4. The first group 10 comprises a first cell 11 and a second cell 12. Both the impedance 13 in the first cell 11 and the impedance 14 in the second cell 12 of the first group 10 are resistors, each having a resistance R. The control of the S switch 15 and W switch 17 in the first cell 11 is coupled to $A_{2,4}$, the fourth bit of the input binary digital signal $A_2$. The control of the S switch 16 and W switch 18 in the second cell 12 is coupled to $A_{1,4}$, the fourth bit of the binary digital signal $A_1$. The second group 20 comprises a first cell 21 and a second cell 22. Both of the impedance 23 in the first cell 21 and the impedance 24 in the second cell 22 of the second group 20 are resistors, each having a resistance 2R.

The control of the S switch 25 and W switch 27 in the first cell 21 is coupled to $A_{2,3}$, the third bit of the input binary digital $A_2$. The control of the S switch 26 and W switch 28 in the second cell 22 is coupled to $A_{1,3}$, the third bit of the input binary digital $A_1$. The third group 30 comprises a first cell 31 and a second cell 32. Both the impedance 33 in the first cell 31 and the impedance 34 in the second cell 32 of the third group 30 are resistors, each having a resistance 4R.

The control of the S switch 35 and W switch 37 in the first cell 31 is coupled to, $A_{2,2}$, the second bit of the input binary digital signal $A_2$. The control of the S switch 36 and W switch 38 in the second cell 32 is coupled to $A_{1,2}$, the second bit of the input binary digital signal $A_1$. The fourth group 40 comprises a first cell 41 and a second cell 42. Both of the impedance 43 in the first cell 41 and the impedance 44 in the second cell 42 of the fourth group 30 are resistors, each having a resistance 8R.

The control of the S switch 45 and W switch 47 in the first cell 41 is coupled to, $A_{2,1}$, the first bit of the input binary digital signal $A_2$. The control of the S switch 46 and W switch 48 in the second cell 42 is coupled to $A_{1,1}$, the first bit of the input binary digital signal $A_1$.

Let $A_1 = A_{1,1} A_{1,2} A_{1,3} A_{1,4} = 0\ 1\ 1\ 0$ $A_2 = A_{2,1} A_{2,2} A_{2,3} A_{2,4} = 1\ 0\ 1\ 1$ then switches 48, 36, 26, 18, 45, 37, 25, 15 will close and switches 46, 38, 28, 16, 47, 35, 27, 17 will open. Consequently, resistors 34, 24, 43, 23, 13 will be connected in parallel across $V_{REF}$ to $V_o$; and resistors 44, 14 and 33 will be connected in parallel across $V_o$ and GND. In other words, resistors with value 4R, 2R, 8R, 2R and R are connected in parallel across $V_{REF}$ to $V_o$; and resistors with 8R, R and 4R are connected in parallel across $V_o$ and GND. Therefore, according to formula (A), $V_o$ is $$V_o = \frac{\sum\limits_{i=1}^{2}\sum\limits_{j=1}^{4} A_{i,j} 2^{j-1}}{2 \sum\limits_{j=1}^{4} 2^{j-1}} V_{REF} = \frac{19}{30} V_{REF}$$

Figure 3:
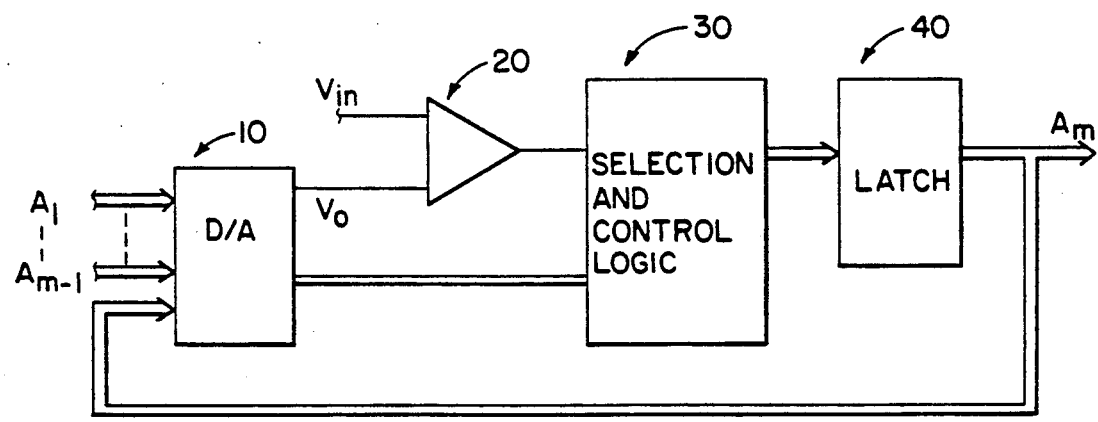
FIG. 3 is block diagram showing how the D/A converter is used in an A/D converter to convert the difference between an analog signal and several digital signals to a digital signal.

Referring now to FIG. 3, there is shown a block diagram of an A/D converter using the present invention. This A/D converter comprises a D/A converter 10 of the present invention, a comparator 20, a selection and control logic portion 30 and a latch 40. The analog output of the D/A converter 10, $V_o$, is coupled to one of the two inputs of the comparator 20. The input analog voltage $V_{in}$ is coupled to the other input of the comparator 20. The output of the comparator 20 is coupled to the input of the selection and control logic portion 30. The output of the selection and control logic portion 30 is coupled to the input of the latch 40. The selection and control logic portion 30 is coupled to the D/A converter 10. The function and operation of the comparator 20, the election and control logic portion 30 and the latch 40 is known in the art and is illustrated, for example, in the aforementioned National Semiconductor Data Conversion/Acquisition Databook, 1984 at pages 5-1 et. seq., which publication is incorporated by reference into this detailed description as if fully set forth herein. The output of the latch 40 is the converted binary digital number which is one of the m binary digital signal inputs of the D/A converter 10. Let all the input digital numbers be denoted $A_1 A_2 \ldots A_m$. $A_1, \ldots, A_m \in G(k)$. Where $A_1, A_2 \ldots A_{m-1}$ are given, then $$A_1 + A_2 + \ldots + A_{m-1} + A_m = V_{in}$$

therefore $A_m = V_{in} - (A_1 + A_2 + \ldots + A_{m-1})$. The time used for this conversion is the same as the conversion when m=1.

Furthermore, if the jth bit of $A_m$ is connected to the jth bit of each of $A_1, A_2, \ldots, A_{m-1}$, then $$A_1 = A_2 = \ldots = A_{m-1} = A_m$$

and $A_1 + A_2 + \ldots + A_{m-1} + A_m = mA_m = V_{in}$

Therefore, $$A_m = V_{in}/m.$$

Some existing D/A use $2^n$ resistors to create all the $2^n$ voltages and a switch network controlled by the input digital signal to select these $2^n$ voltages as the analog output of the D/A. This type of D/A converter uses at least $2^n$ resistors and $2^n$ switches. The present invention uses 2n switches which are controlled by the input digital signals to rearrange a resister network of n resistors to create the analog output of the D/A. For n=16, the former type of D/A converters will use at least 65,536 resistors and 65,536 switches; while the D/A converter of the present invention will use only 16 resistors and 32 switches. Not only the ratio of the number of resistors and switches are quite different (several thousand times for n=16), the concepts of the existing D/A converter and the D/A converter of the present invention are also quite different.

It will be understood that various changes in details, materials, and arrangements of the part which have been described and illustrated in order to explain the nature of this invention, may be made by those skilled in the art without departing from the principle and scope of the invention as expressed in the following claims.

I claim:

1. An apparatus for converting at least one digital signal having at least one binary bit to an analog signal, said apparatus comprising at least one group, each group having at least one cell, wherein each cell comprises:
   (a) a weighted impedance;
   (b) a first switch having a switch control input;
   (c) a second switch having a switch control input;
   (d) means for electrically connected said first switch in series with said impedance across a first voltage $V_o$ and a second voltage $V_{REF}$;
   (e) means for electrically connecting said second switch in series with the impedance across the second voltage $V_{REF}$ and a third voltage $V_B$; and
   (f) means for electrically connecting a signal representing said at least one binary bit to the switch control input of said first switch and the switch control input of said second switch.

2. An apparatus in accordance with claim 1 additionally comprising a scaling impedance $Z_e$ electrically connected between $V_o$ and $V_B$.

3. An apparatus for converting an analog signal to a digital signal, said apparatus including a comparator having an output coupled to an input of a selection and control logic portion an output of which is coupled to the input of a latch, said latch having an output which is coupled to the input of a digital signal to analog converter, said selection and control logic portion also being coupled to said digital to analog signal converter wherein said digital to analog signal converter comprises at least one group, each group having at least one cell, wherein each cell comprises:
   (a) a weighted impedance;
   (b) a first switch having a switch control input;
   (c) a second switch having switch control input;
   (d) means for electrically connecting said first in series with said impedance across a first voltage $V_o$ and a second voltage $V_{REF}$;
   (e) means for electrically connecting said second switch in series with the impedance across said second voltage $V_{REF}$ and a third voltage $V_B$; and
   (f) means for electrically connecting a signal representing said at least one binary bit to the switch control input of said first switch and the switch control input of said second switch.

4. An apparatus in accordance with claim 2 wherein said digital to analog signal converter comprises at least one group, each group having at least 2 cells and including means for electrically connecting together the signals representing the binary bits which are electrically connected to each of said cells.

* * * * *